(12) United States Patent
Hanamaki

(10) Patent No.: US 6,774,389 B2
(45) Date of Patent: Aug. 10, 2004

(54) OPTICAL SEMICONDUCTOR DEVICE

(75) Inventor: Yoshihiko Hanamaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/290,254

(22) Filed: Nov. 8, 2002

(65) Prior Publication Data

US 2003/0132431 A1 Jul. 17, 2003

(30) Foreign Application Priority Data

Jan. 17, 2002 (JP) ........................................ 2002-008667

(51) Int. Cl.$^7$ .............................................. H01L 29/06
(52) U.S. Cl. .............................. 257/14; 257/13; 257/17; 257/23; 257/96; 257/101; 438/22; 438/37
(58) Field of Search ............................... 257/14, 13, 23, 257/17, 96, 101, 102; 438/22, 37

(56) References Cited

U.S. PATENT DOCUMENTS

| | | | | |
|---|---|---|---|---|
| 5,392,306 A | * | 2/1995 | Usami et al. | 372/45 |
| 5,455,429 A | * | 10/1995 | Paoli et al. | 257/20 |
| 5,557,627 A | * | 9/1996 | Schneider, Jr. et al. | 372/46 |
| 6,096,617 A | * | 8/2000 | Kizuki | 438/312 |
| 6,645,785 B2 | * | 11/2003 | Koike et al. | 438/47 |

FOREIGN PATENT DOCUMENTS

| | | |
|---|---|---|
| JP | 6-334258 | 12/1994 |
| JP | 11-243249 | 9/1999 |
| JP | 2000-82862 | 3/2000 |

OTHER PUBLICATIONS

Kadono et al.: "Time Resolved Photoluminescence on Be doped GaAs/AlAs MQW", 48$^{th}$ OYO–Butsuri, 28p–YD–3 (Mar. 2001).

* cited by examiner

Primary Examiner—Nathan J. Flynn
Assistant Examiner—Remmon R. Fordé
(74) Attorney, Agent, or Firm—Leydig, Voit & Mayer, Ltd.

(57) ABSTRACT

A semiconductor optical device with improved optical gain and enhanced switching characteristics. The semiconductor optical device includes positive and negative electrodes for providing holes and electrons, respectively. The semiconductor optical device also includes an active layer between the positive and negative electrodes. The active layer includes a multiple quantum well structure having p-type quantum well layers and barrier layers. The quantum well layers are doped with an impurity that diffuses less than zinc so that trapping holes are produced and excessive electrons contributing no light emission are quenched by the trapping holes. The impurity can be beryllium, magnesium, or carbon.

8 Claims, 3 Drawing Sheets

OPTICAL SEMICONDUCTOR DEVICE

BACKGROUND OF THE INVENTION

1) Technical Field of the Invention

The present invention relates to a semiconductor optical device, and in particular, relates to the semiconductor optical device including an active layer having a quantum well structure including a plurality of quantum well layers and barrier layers, in which each of the quantum well layers is doped with a dopant impurity producing p-type conductivity.

2) Description of Related Arts

In semiconductor optical device including the active layer having a quantum well structure, positive and negative electrodes (referred to simply as p- and n-electrodes, respectively) sandwich the active layer. A plurality of holes and electrons are injected from the p- and n-electrodes, respectively, and reach the active layer. In the active layer of the quantum well structure having a plurality of quantum well layers and barrier layers, holes and electrons meet and couple with each other within the quantum well layers, and thereby emitting light.

Since electrons, in general, have a mobility greater than that of holes, more electrons are injected into the quantum well layers than holes. Thus, an excess of electrons that contribute no light emission are left in the quantum well layers. Disadvantageously, the excessive electrons absorb the light emitted by the coupling of holes and electrons, thereby decreasing optical gain of the semiconductor optical device. Also, the excessive electrons reduce switching rate of the semiconductor optical device.

To solve those disadvantages, one approach has been proposed, in which the quantum well layer is doped with zinc as a hole source so as to quench the excessive electrons with the doped holes, thereby improving the optical gain of the semiconductor optical device. However, in practice, the zinc doping adversely causes the half-value width of the wavelength to be wider, and the threshold current and the operation current to be increased. The present inventors have studied the mechanism of the aforementioned problems and found that a substantial amount of zinc in the quantum well layers is thermally diffused into the well layers during the forming process of the semiconductor optical device.

JPA 06-334258 discloses a semiconductor laser device having a multiple quantum well structure including quantum well layers that are doped with zinc as a p-type impurity. However, it addresses prevention of the emission recombination current in the barrier layers by doping with the p-type impurity in quantum well layers with compression distortion. It fails to disclose a motivation to cancel the excessive electrons in the quantum well layers with the holes. In addition, JPA 06-334258 teaches that the p-type impurity of zinc would thermally be diffused so that many problems, such as the increased threshold current, occur, as described above.

Therefore, one aspect of the present invention has an object to provide a semiconductor optical device with an improved optical gain and an enhanced switching characteristics.

SUMMARY OF THE INVENTION

A first aspect of the present invention is to provide a semiconductor optical device including a positive and negative electrodes for providing holes and electrons, respectively. The semiconductor optical device also includes an active layer provided between the positive and negative electrodes. The active layer includes a multiple quantum well structure having a plurality of quantum well layers and barrier layers. The quantum well layers are doped with a p-type impurity less diffusible than zinc so that a plurality of trapping holes are produced and a plurality of excessive electrons contributing no light emission are quenched by the trapping holes. The p-type impurity can be beryllium, magnesium, or carbon.

A second aspect of the present invention is to provide a process for forming a semiconductor optical device includes growing a lower cladding layer on a semiconductor substrate at a first growth rate. Also, the process includes growing an active layer over the lower cladding layer, the active layer including a multiple quantum well structure having a plurality of quantum well layers doped with a p-type impurity less diffusible than zinc and a plurality of barrier layers. Further, the process includes growing an upper cladding layer over the active layer. The active layer is grown at a second growth rate that is about 1.5 to about 2.5 times of the first growth rate. The lower and upper cladding layers and the active layer are grown by MOCVD.

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper", "lower", "right", and "left") are conveniently used just for clarity, it should not be interpreted that those terminology limit the scope of the present invention.

Embodiment 1.

Figure 1:
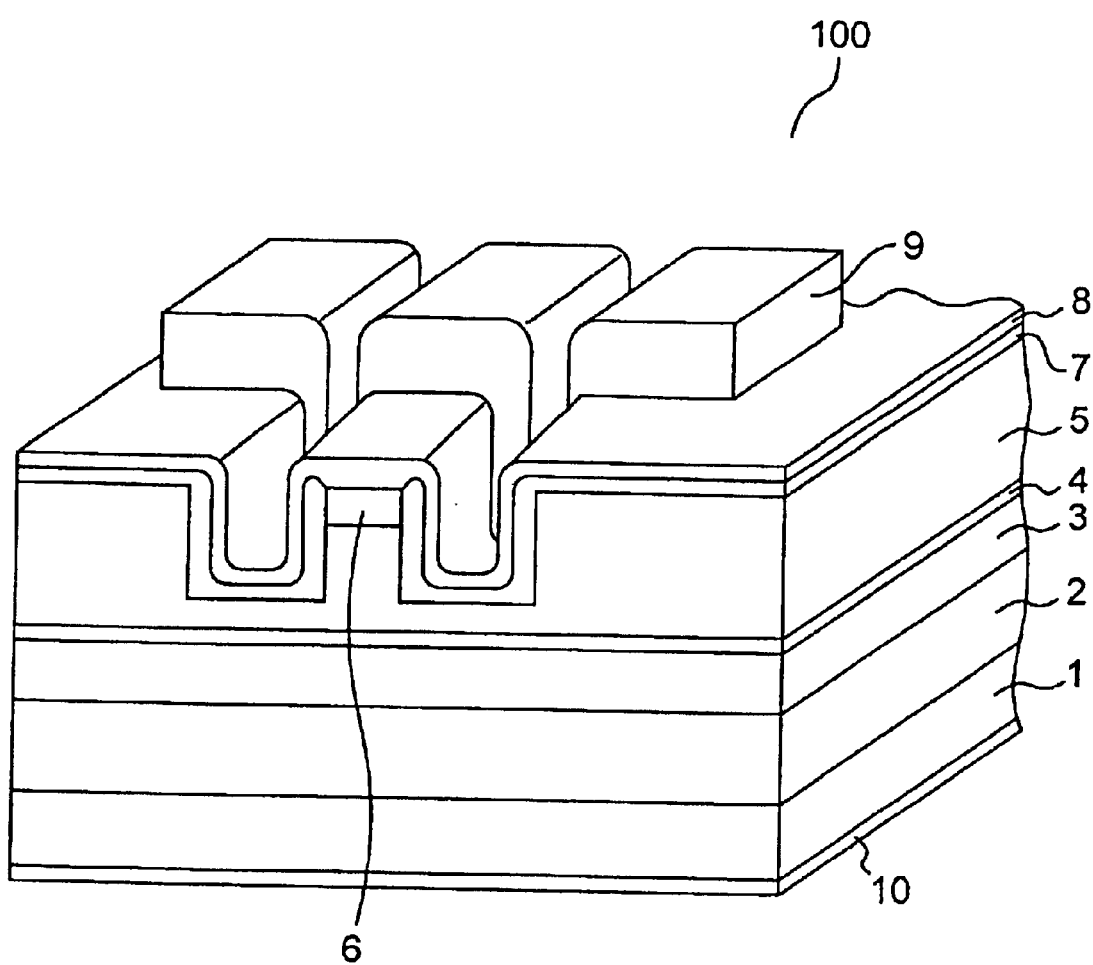
FIG. 1 is a perspective view of an InP based ridge-type semiconductor laser device according to Embodiment 1 of the present invention.

FIG. 1 is a perspective view of an InP based ridge-type semiconductor laser device 100 according to Embodiment 1 of the present invention. The semiconductor laser device includes a substrate 1 of n-InP. Grown on the substrate 1 are a buffer layer 2 of n-InP and a lower cladding layer 3 of n-AlInAs. Grown on the lower cladding layer 3 is an active layer 4 of a multiple quantum well structure having a plurality of quantum well layers and barrier layers both made of AlGaInAs. Each of the quantum well layers and the barrier layers have thickness in a range of about 5 to 10 nm and about 10 to 20 nm, respectively. Further, an upper cladding layer 5 of p-AlInAs is deposited on the active layer 4.

The upper cladding layer 5 has a pair of trenched portions so as to form a ridge portion. While an insulating layer 7 of silicon dioxide is deposited on the top surface of the upper cladding layer 5, the ridge portion of the upper cladding layer 5 is covered by a contact layer 6 of p-InP. Also, deposited both on the contact layer 6 and the insulating layer 7 are a thin layer of Au and a top electrode 9 plated by Au. Meanwhile, formed on the bottom surface of the substrate 1 is a back electrode 10 of Au.

Although not shown in FIG. 1, one or more BDR (Band Discontinuity Reduction) layers can be formed between the buffer layer 2 and the lower cladding layer 3. Also, a plurality of light confinement layers of p- and n-AlGaInAs can be formed over and under the active layer 4, respectively.

The composition, thickness, carrier concentration and strain of each layer composing the semiconductor laser device 100 of Embodiment 1 are shown in Table 1 as follows. The active layer 4 indicated in Table 1 includes a plurality of quantum well layers and barrier layers both made of AlGaInAs. Thus, Table 1 illustrates an another structural example of the semiconductor laser device, any other compositions can be exploited as known by the persons skilled in the art. For instance, any AlGaInAs layers except AlInAs layers in Table 1 can be substituted by InGaAsP layers.

TABLE 1

| | composition (nm) | thickness (nm) | carrier concentration (×1E18cm-3) | strain (%) |
|---|---|---|---|---|
| p-InP cap layer | — | 100 | 1.0 | — |
| p-AlInAs cladding layer | — | 50 | 1.4 | — |
| p-AlGaInAs confinement layer | 950 ± 20 | 40 | undope | — |
| p-AlGaInAs confinement layer | 980 ± 20 | 30 | undope | — |
| p-AlGaInAs confinement layer | 1010 ± 20 | 30 | undope | −0.3 |
| i-AlGaInAs barrier layer | 1010 ± 20 | 10 | undope | −0.3 |
| i-AlGaInAs quantum well layer | λg obtained | 5 | undope | 1.0 |
| n-AlGaInAs confinement layer | 1010 ± 20 | 30 | −1.0 | −0.3 |
| n-AlGaInAs confinement layer | 980 ± 20 | 30 | −1.0 | — |
| n-AlGaInAs confinement layer | 950 ± 20 | 40 | −1.0 | — |
| n-AlInAs cladding layer | — | 90 | −1.0 | — |
| n-AlGaInAs BDR layer | 950 ± 20 | 5 | −1.0 | — |
| n-AlGaInAs BDR layer | 1040 ± 20 | 5 | −1.0 | — |
| n-InP buffer layer | — | 1000 | −1.0 | — |

Figure 2:
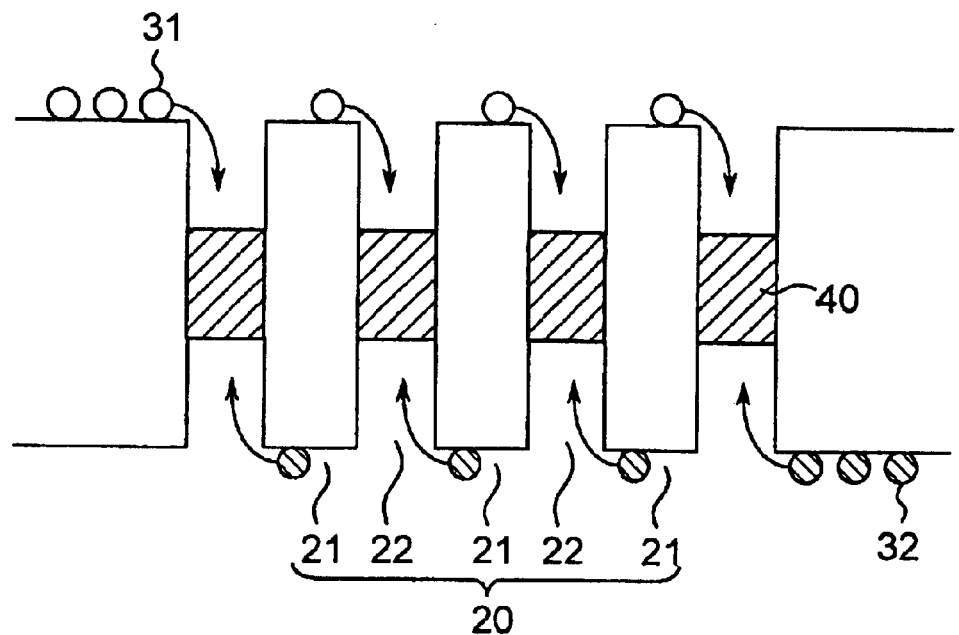
FIG. 2 is a band diagram in the active layer of the semiconductor laser device of Embodiment 1.

FIG. 2 is a band diagram in the active layer of the semiconductor laser device 100 of Embodiment 1. In the drawing, the left side is one of the positive (top) electrode and the right side is one of the negative (back) electrode. The active layer 20 of the multiple quantum well structure includes a plurality of barrier layers 21 and quantum well layers 22 both made of AlGaInAs. Each of the barrier layers 21 has a composition such that ν (=Eg/h: wherein Eg is a band gap energy and h is the Planck's constant) is 1010±20 nm. Also, each of the quantum well layers 22 has a composition such that the desired wavelength (λg) is obtained.

Each of the quantum well layers 22 is evenly doped with a p-type impurity 40 thermally less diffusible than zinc such as beryllium, magnesium, and carbon.

In the present invention, the quantum well layers 22 are doped with beryllium instead of zinc so that the thermal diffusion of the p-type impurity can be prevented during the forming process of the semiconductor laser device 100. Thus, this prevents the dopants 40 from being diffused from the quantum well layers 22 into the barrier layers 21 so that the interface steepness over the distribution of the impurity concentration is secured at the heterointerface, thereby maintaining the optical gain of the semiconductor laser device 100 to be high.

In the operation of the semiconductor laser device 100, electrons 31 and holes 32 are injected from the top and back electrodes, respectively. Also, electrons 31 and holes 32 moves to the active layer 20 and couple with each other, thereby emitting the light. As above, since the mobility of the electrons 31 is greater than that of the holes 32, more electrons 31 in number are provided with the quantum well layer 22 than the holes 32. To this end, there are many excessive electrons left in the quantum well layer 22 that contribute no light emission.

According to the semiconductor laser device 100 of the present invention, the p-type dopant 40 thermally less diffusible than zinc is doped into the quantum well layers 22 so as to produce the trapping holes therein so that the excessive electrons are coupled with and quenched by the trapping holes. This avoids the light absorption by the excessive electrons so as to improve the optical gain of the semiconductor laser device 100. Also, since the excessive electrons can substantially be reduced immediately after cutting off the current through the semiconductor laser device 100, the switching rate thereof can be enhanced.

The concentration of the p-type dopant 40 falls within a range between about $5 \times 10^{18}$ to about $2 \times 10^{19}/cm^3$, and preferably, between about $1 \times 10^{19}$ to about $2 \times 10^{19}/cm^3$.

Next, the forming process of the semiconductor laser device 100 will be described hereinafter. In the forming process of the present invention, firstly, a substrate 1 of n-InP is prepared. The buffer layer 2 of n-InP and the lower cladding layer 3 of n-AlInAs are deposited on the substrate 1 by the MOCVD technique (metal-organic chemical vapor deposition). Throughout the forming process of the semiconductor laser device 100, the substrate temperature is kept lower by about 20° C. than that in the forming process generally performed. For example, assuming that the general substrate temperature is 580° C., the substrate temperature is set to about 560° C. according to the present embodiment.

Then, the active layer 4 is formed (grown) on the lower cladding layer 3 at a growth rate more rapid by about 1.5 to about 2.5 times, preferably by about 1.5 to about 2.0 times of that of the lower cladding layer 3. As above, the quantum well layers are doped with the p-type dopant such as beryllium, magnesium, and carbon with source material of organic beryllium vapor, organic magnesium vapour, and TMA/TMG, respectively. Preferably, the p-type impurity is provided in a range between about $1 \times 10^{19}$ to about $2 \times 10^{19}/cm^3$.

After forming the upper cladding layer 5 and the contact layer 6 on the active layer 4, the ridge portion are formed by etching. Then, the insulating layer 7 of material such as silicon dioxide is grown, for example, by thermal MOCVD.

Lastly, the thin layer 8 of Au, the top electrode 9 plated by Au, and the back electrode 10 of Au are formed. Thus, the semiconductor laser device 100 is completed in the aforementioned process.

In the doping step of the p-type dopant, atoms of beryllium, magnesium, and carbon are more likely to agglomerate in the quantum well layers than zinc. However, when the substrate temperature is kept lower and the active layer 4 is deposited at the deposition rate more rapid as above, the agglomeration of the p-type dopant in the quantum well layers can be avoided.

Figure 3:
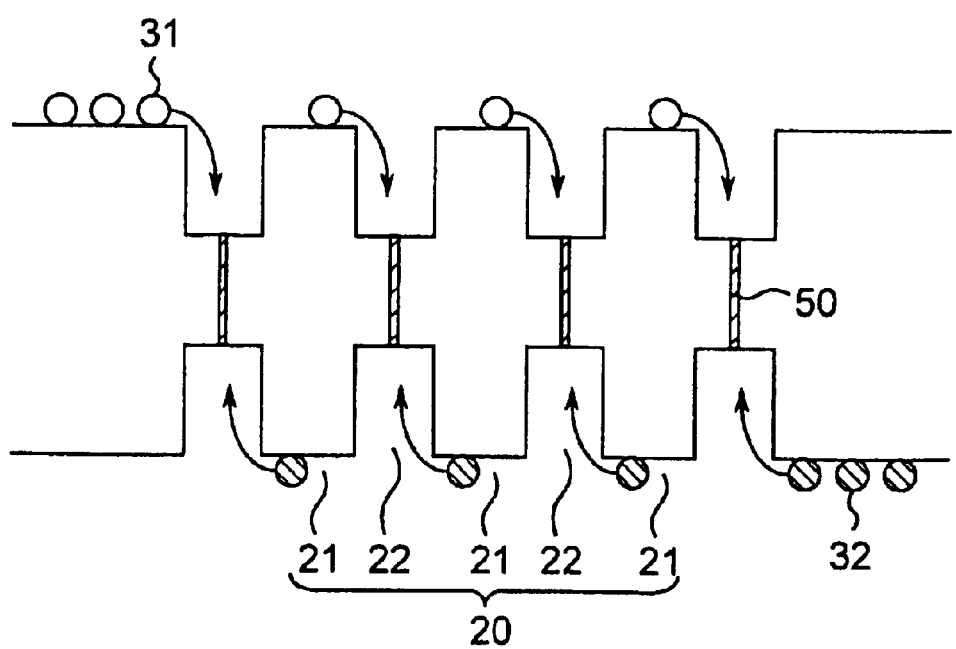
FIG. 3 is a band diagram in an alternative active layer of the semiconductor laser device of Embodiment 1.

FIG. 3 is a band diagram in an alternative active layer of the semiconductor laser device 100 of Embodiment 1. Similar portions of FIG. 3 are denoted by similar or corresponding reference numerals of FIG. 2. As illustrated in FIG. 3, only a thin layer located substantially in the middle of each of the quantum well layers is doped with the p-type dopant 50. This technique is so-called a delta-doping. The impurity concentration of the p-type dopant 50 of FIG. 3 falls within a range between about $5 \times 10^{18}$ to about $2 \times 10^{19}/$ cm$^3$ as that of FIG. 2. In the step of the delta-doping, the quantum well layer 21 is interrupted to grow, and only the p-type dopant is provided.

Embodiment 2.

Figure 4:
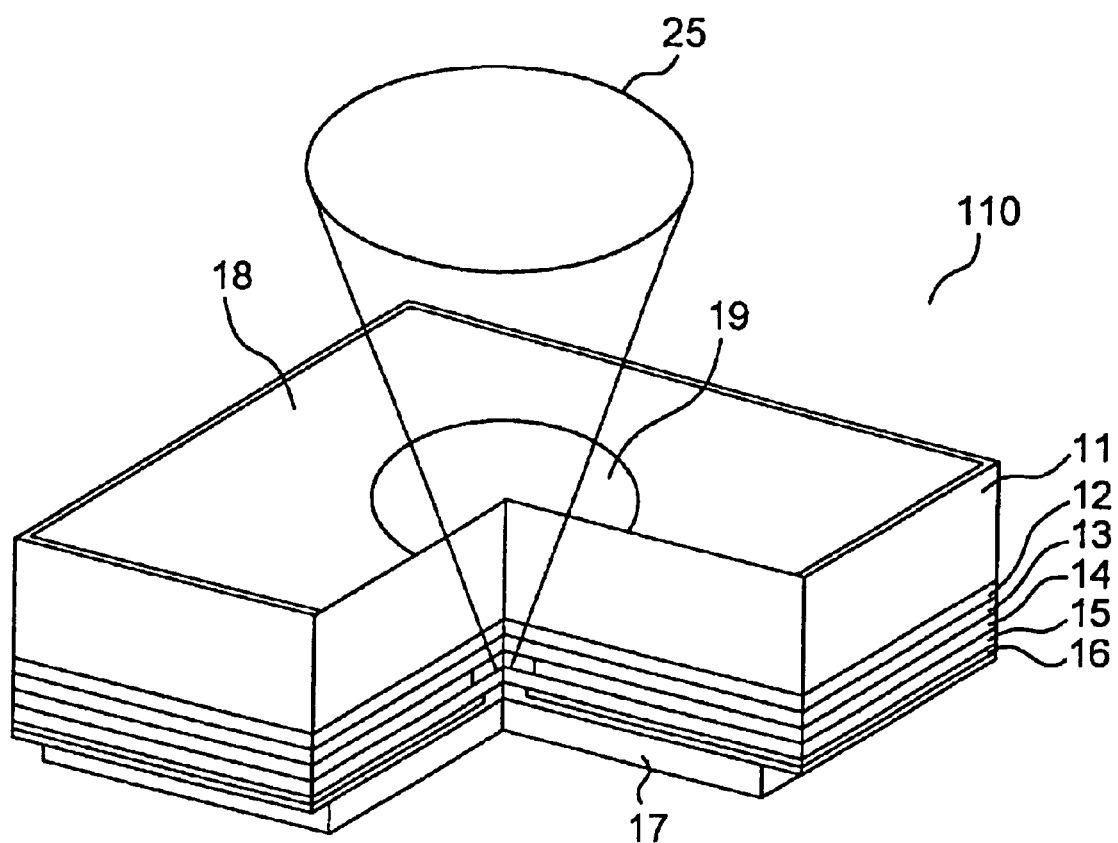
FIG. 4 is a perspective view of a light emitting diode (LED) device according to Embodiment 2 of the present invention.

FIG. 4 is a perspective view of an InP based surface-emitting type light emitting diode (LED) device 110 according to Embodiment 2 of the present invention. The LED device 110 includes a substrate 11 of n-InP. Deposited on the substrate 11 are an n-InP layer 12 and an n-InGaAsP layer 13. Formed on the n-InGaAsP layer 13 is an active layer 14 of a multiple quantum well structure having a plurality of quantum well layers and barrier layers made of InGaAsP and InP, respectively. Further, a p-InGaAsP layer 15 and an insulating layer 16 of silicon dioxide are formed on the active layer 14. Finally, a thin layer of Au, a top electrode 17 plated by Au, and a back electrode 18 of Au are formed.

In the LED device 110, when an operational voltage is applied between the top and back electrodes 17, 18, the active layer 14 emits the light, which is irradiated through the window 19 outwardly.

The active layer 14 also has a multiple quantum well structure similar to those illustrated in FIGS. 2, 3. Thus, according to the structure of the active layer 14, the light absorption by the excessive electrons is prevented so as to improve the optical gain of the LED device 110. Also, since the excessive electrons can substantially be reduced immediately after cutting off the current through the LED device 110, the switching rate thereof can be enhanced.

It should be noted that although the InP substrate are used for forming the laser and LED devices in Embodiments 1 and 2, it can be substituted by a GaAs substrate. The combinations of materials applicable to those for the quantum well layers and barrier layers with the InP and GaAs substrates are shown in the following Tables 2 and 3, respectively.

TABLE 2

| quantum well layer | barrier layer |
|---|---|
| AlGaInAs | AlGaInAs |
| AlGaInAs | InGaAsP |
| InGaAsP | InGaAsP |
| InGaAsP | AlGaInAs |
| InGaAs | AlGaInAs |
| InGaAs | InGaAsP |

TABLE 3

| quantum well layer | barrier layer |
|---|---|
| GaAs | AlGaAs |
| GaAs | AlGaInAs |
| AlGaAs | AlGaAs |
| AlGaAs | AlGaInAs |
| AlGaInAs | AlGaAs |
| AlGaInAs | AlGaInAs |
| InGaAs | GaAs |
| InGaAs | AlGaAs |
| InGaAs | AlGaInAs |

Also, the active layer of the quantum well structure according to the present invention can be used for a light modulator device as well as the semiconductor laser device and the LED device.

As described above, the semiconductor optical device according to the present invention can improve the optical gain, and enhance the switching rate thereof. In addition, according to the forming process of the semiconductor optical device of the quantum well structure, the quantum well layers can exclusively be doped with the p-type impurity in an efficient and stable manner.

What is claimed is:

1. A semiconductor optical device, comprising:
    positive and negative electrodes for providing holes and electrons, respectively; and
    an active layer between said positive and negative electrodes, said active layer including a multiple quantum well structure having a plurality of quantum well layers and barrier layers, wherein the quantum well layers are p-type and doped with an impurity diffusing less than zinc so that a plurality of trapping holes are produced and a plurality of excessive electrons contributing no light emission quenched by the trapping holes.

2. The semiconductor optical device according to claim 1, wherein the impurity diffuses less than zinc at a forming temperature of the semiconductor optical device.

3. The semiconductor optical device according to claim 1, wherein the impurity producing p-type conductivity is selected from the group consisting of beryllium, magnesium, and carbon.

4. The semiconductor optical device according to claim 1, wherein each of the quantum well layers is doped with the impurity in a concentration in a range between about $5 \times 10^{18}$ to about $2 \times 10^{19}$/cm$^3$.

5. The semiconductor optical device according to claim 1, wherein each of the quantum well layers is doped with the impurity in a concentration in a range between about $1 \times 10^{19}$ to about $2 \times 10^{19}$/cm$^3$.

6. The semiconductor optical device according to claim 1, wherein each of the quantum well layers is uniformly doped with the impurity.

7. The semiconductor optical device according to claim 1, wherein each of the quantum well layers is delta-doped with the impurity.

8. The semiconductor optical device according to claim 1, wherein the quantum well layers and the barrier layers are composed of one of AlGaInAs and InGaAsP.

* * * * *